(12) United States Patent
Nishimura et al.

(10) Patent No.: US 11,393,892 B2
(45) Date of Patent: Jul. 19, 2022

(54) DISPLAY DEVICE

(71) Applicant: Japan Display Inc., Tokyo (JP)

(72) Inventors: Masumi Nishimura, Tokyo (JP);
Hiroshi Tabatake, Tokyo (JP); Akihito Sato, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 238 days.

(21) Appl. No.: 16/879,773

(22) Filed: May 21, 2020

(65) Prior Publication Data

US 2020/0286978 A1    Sep. 10, 2020

Related U.S. Application Data

(63) Continuation of application No. PCT/JP2018/031193, filed on Aug. 23, 2018.

(30) Foreign Application Priority Data

Nov. 22, 2017  (JP) .............................. JP2017-224788

(51) Int. Cl.
*H01L 27/32*  (2006.01)
(52) U.S. Cl.
CPC ................. *H01L 27/3276* (2013.01)
(58) Field of Classification Search
CPC .................................................. H01L 27/3276
USPC ..................................................... 361/679.21
See application file for complete search history.

(56) References Cited

U.S. PATENT DOCUMENTS

| 7,550,325 B2* | 6/2009 | Koyama | G02F 1/13454 |
| | | | 438/161 |
| 2010/0060602 A1* | 3/2010 | Agari | G06F 3/0445 |
| | | | 345/173 |
| 2014/0246678 A1* | 9/2014 | Sato | H01L 27/3262 |
| | | | 257/59 |
| 2014/0300852 A1* | 10/2014 | Yoshida | G02F 1/134336 |
| | | | 349/143 |

(Continued)

FOREIGN PATENT DOCUMENTS

| JP | 2017-049483 A | 3/2017 |
| WO | 2016/080291 A1 | 5/2016 |

OTHER PUBLICATIONS

International Search Report and Written Opinion dated Oct. 16, 2018 for PCT/JP2018/031193 filed on Aug. 23, 2018, 7 pages including English Translation of the International Search Report.

(Continued)

*Primary Examiner* — Sherman Ng
(74) *Attorney, Agent, or Firm* — Xsensus LLP

(57) ABSTRACT

A display includes a plurality of first wirings which are provided on a first layer and each of which is arranged parallel to a first direction in a first area, and which are arranged on a second layer in a second area; a second wiring which is provided in the first layer in the first area and which is provided on a layer in the second area; and a third wiring which is provided on the first layer and arranged between the first wirings in the first area and which is arranged to intersect with first wirings in the second area. The first wirings is arranged to be inclined to the same side in the first direction in the second area. The second wiring is arranged to intersect with a portion of the plurality of first wirings in a plan view, in the second area.

7 Claims, 11 Drawing Sheets

(56) References Cited

U.S. PATENT DOCUMENTS

| | | |
|---|---|---|
| 2016/0064466 A1 | 3/2016 | Son et al. |
| 2016/0093685 A1 | 3/2016 | Kwon et al. |
| 2016/0300863 A1* | 10/2016 | Koide ................. H01L 27/3279 |
| 2017/0336667 A1 | 11/2017 | Yamamoto et al. |
| 2018/0076192 A1* | 3/2018 | Kim .................... H01L 27/0266 |

OTHER PUBLICATIONS

Notice of Reasons for Refusal dated Aug. 17, 2021 in Japanese Application No. 2017-224788.

* cited by examiner

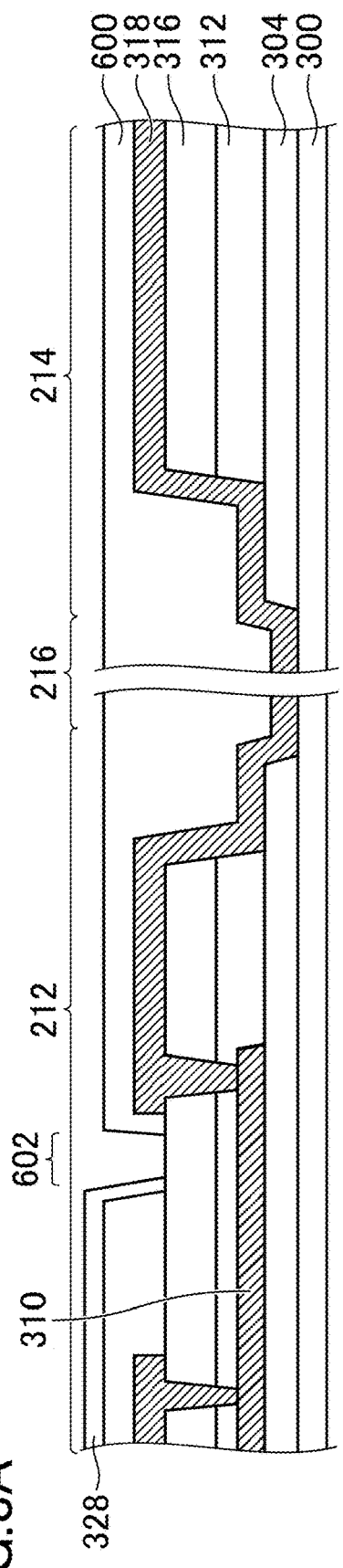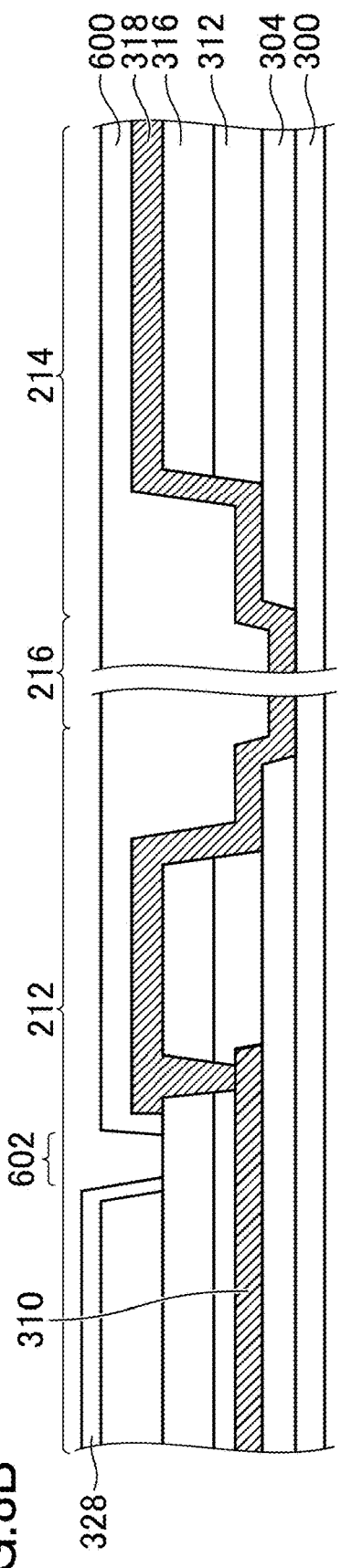

DISPLAY DEVICE

CROSS-REFERENCE TO RELATED APPLICATION

The present application is Bypass Continuation of International Application No. PCT/JP2018/031193, filed on Aug. 23, 2018, which claims priority from Japanese Application No. JP 2017-224788 filed on Nov. 22, 2017. The contents of these applications are hereby incorporated by reference into this application.

BACKGROUND OF THE INVENTION

1. Field of the Invention

The present invention relates to a display device.

2. Description of the Related Art

A flat panel display such as an organic electroluminescence (EL) display device includes a display panel in which a thin film transistor or an organic light-emitting diode are formed on a substrate. The display panel displays an image by an input of a power supply or a signal via a wiring.

For example, JP 2017-49483 A discloses that a signal or the like generated by a driver IC is input to a display area via a wiring.

SUMMARY OF THE INVENTION

Recently, as the high resolution of display devices increases, the number of wirings arranged between a driver IC and a display area increases. If the number of wirings increases, a distance between the wirings is shortened, and thus it is required to thin the wirings.

The wiring is not arranged perpendicular to one side of the display area, but is generally arranged in an inclined manner. If the wirings are arranged an inclined manner, a distance between the wirings is shortened, and thus it is required to thin the wirings.

However, if the wirings are thinned, a resistance of the wirings increases, and thus power consumption increases. If the wiring is thickened, the adjacent wirings are short-circuited, and it is more likely to cause display failure.

The present invention has been made in view of the above problems, and the purpose thereof is to reduce the resistance of wiring provided in a display device.

According to one aspect of the present invention, there is provided a display device. The display includes a plurality of first wirings which are provided on a first layer and each of which is arranged parallel to a first direction in a first area, and which are arranged on a second layer in a second area adjacent to the first area; a second wiring which is provided in the first layer and is arranged between the plurality of first wirings in the first area and which is provided on a layer different from the second layer in the second area; and a third wiring which is provided on the first layer and arranged between the plurality of first wirings in the first area and which is provided on a layer different from the second layer and arranged to intersect with at least a portion of the plurality of first wirings in a plan view, in the second area. A portion of the plurality of first wirings is arranged to be inclined to the same side in the first direction in the second area. The second wiring is arranged to intersect with a portion of the plurality of first wirings in a plan view, in the second area.

BRIEF DESCRIPTION OF THE DRAWINGS

FIG. 8A is a diagram illustrating a cross section of the frame area, the curved area, and the connection area;

FIG. 8B is a diagram illustrating a cross section of the frame area, the curved area, and the connection area;

DETAILED DESCRIPTION OF THE INVENTION

Figure 1:
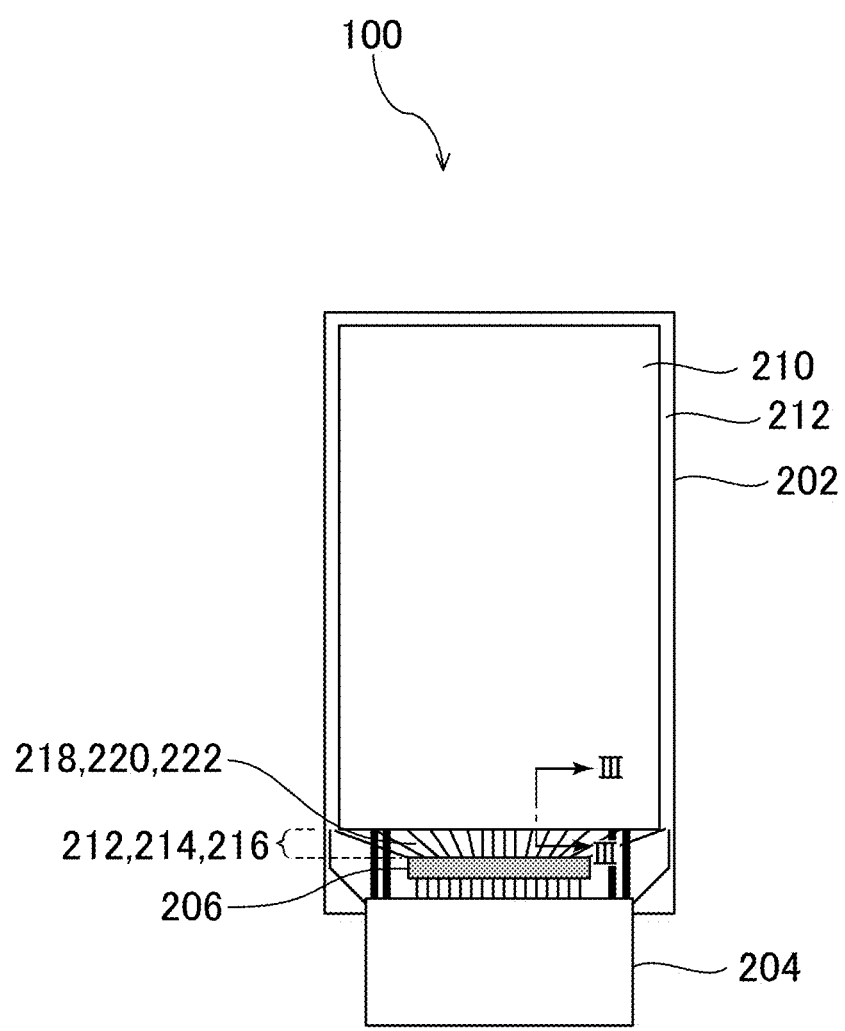
FIG. 1 is a diagram schematically illustrating a display panel according to an embodiment of the present invention.

Hereinafter, embodiments of the present invention are described below with reference to the drawings. For clearer description, drawings may be schematically illustrated in terms of a width, a thickness, a shape, and the like of each part as compared to the actual embodiment, but this is merely an example and do not limit the interpretation of the present invention. In the specification and the drawings, components similar to those described with respect to a previous drawing are denoted by the same reference numerals, and detailed descriptions thereof are appropriately omitted.

In the following embodiments, an organic EL display device is exemplified as a disclosure example, but other application examples include any flat panel type display device such as a liquid crystal display device, another self-light-emitting display device, or an electronic paper type display device including an electrophoresis element. It is obvious that, the embodiments can be applied without any particular limitation, from a small or medium display device to a large display device.

FIG. 1 is a schematic diagram illustrating a configuration of a display panel 100 according to an embodiment of the present invention. As illustrated in FIG. 1, the display panel 100 includes a first substrate 202, a second substrate 204, and a driver IC 206.

The first substrate 202 includes a display area 210, a frame area 212, a connection area 214, and a curved area 216. In the present example, a first area in the claims corresponds to the curved area 216, a second area corresponds to the connection area 214, and a third area corresponds to the frame area 212.

The display area 210 includes a pixel array portion. The pixel array portion includes a terminal that supplies power and a signal for lighting a pixel for each pixel. In each pixel, a plurality of TFTs 302 described below and capacitors are arranged. Terminals included in the pixel array portion are, for example, terminals for inputting a scanning signal or a video signal supplied from the driver IC 206 or a power supply voltage via a first wiring 218 to a third wiring 222 described below.

The frame area 212 is an area arranged around the display area 210 including the pixel array portion. Specifically, for example, in the frame area 212 on the right and the left of the display area 210, a circuit (hereinafter, referred to as a Y driver) that generates a signal for selecting a row of the pixel array portion or the like is arranged. In the upper and lower frames of the display area 210, a wiring for routing a power supply, the first wiring 218 to the third wiring 222 described below, and the like are arranged.

Figure 4A:
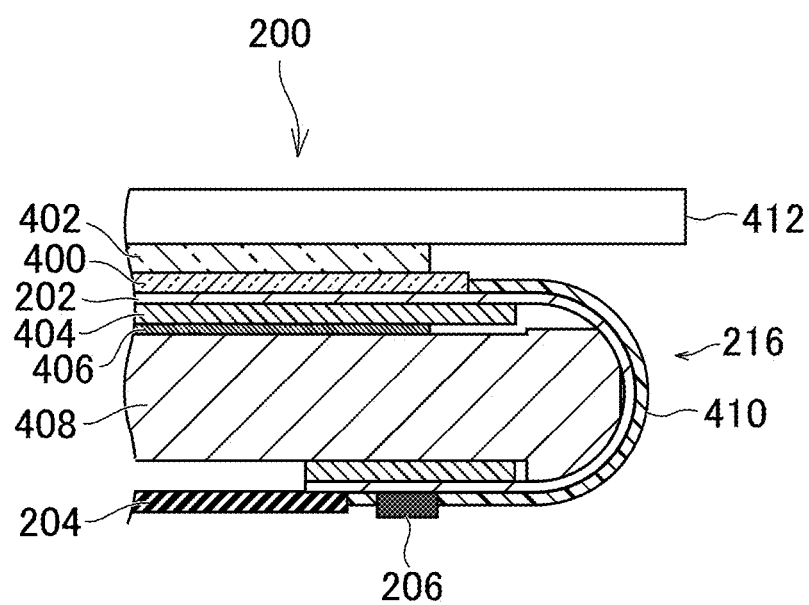
FIG. 4A is a diagram illustrating a cross section of the curved display panel.
Figure 4B:
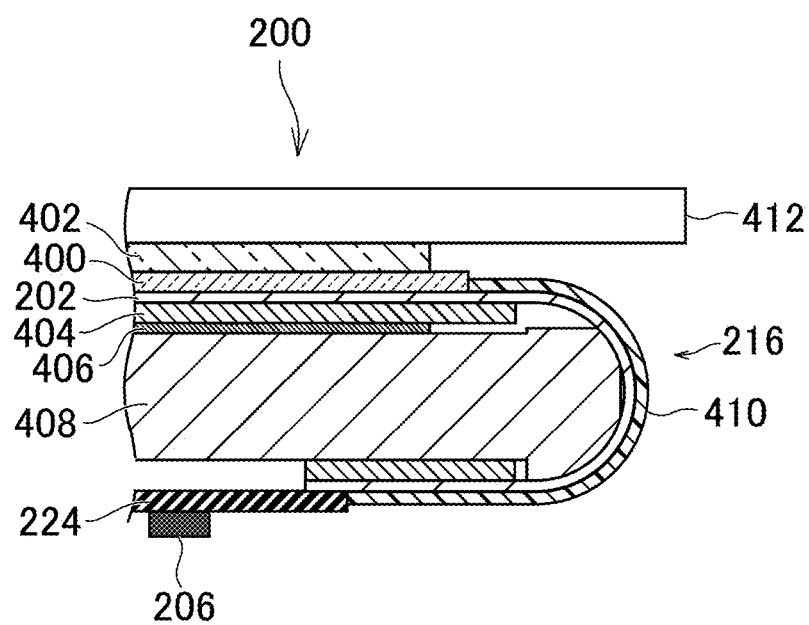
FIG. 4B is a diagram illustrating a cross section of the curved display panel.

The connection area 214 is an area which is arranged on the back surface of the display area 210 and to which the power supply voltage and the video signals are supplied. Specifically, the connection area 214 is an area arranged on the back surface of the display area 210 as illustrated in FIGS. 4A and 4B described below by the curve of the curved area 216. In the connection area 214, the first wiring 218 to the third wiring 222 are arranged. The connection area 214 is an area to which a Y driver control signal and a video signal are supplied from the driver IC 206, and a power supply voltage is supplied from an FPC.

The curved area 216 is an area which links the frame area 212 and the connection area 214 and is curved so that the connection area 214 is arranged on the back surface of the display area 210. Specifically, the curved area 216 is arranged between the frame area 212 and the connection area 214 and links the frame area 212 and the connection area 214. By the curve of the curved area 216, the connection area 214 is arranged on the back surface of the display area 210.

The second substrate 204 is a flexible printed circuit (FPC). The second substrate 204 is connected to the first substrate 202, and circuit components and the like are arranged thereon. The second substrate 204 is connected to an external device that supplies a power supply voltage or a video signal to the display panel 100. The power supply voltage supplied from the second substrate 204 is supplied to the pixel array portion via the second wiring 220 and the third wiring 222. The Y driver power supply voltage supplied from the second substrate 204 is supplied to a Y driver via a Y driver power supply line 500.

The driver IC 206 is an IC arranged on the first substrate 202. Specifically, for example, as illustrated in FIG. 1, the driver IC 206 is a chip on glass (COG) directly arranged on the first substrate 202. The driver IC 206 is an IC that generates a video signal, a Y driver control signal, and the like that are supplied to the pixel array portion based on the video signal and the power supply voltage supplied from the second substrate 204. The video signal generated by the driver IC 206 is supplied to the pixel array portion via the first wiring 218 arranged in the connection area 214, the curved area 216, and the frame area 212. The Y driver control signal is supplied to the Y driver via a Y driver signal line 502. The pixel array portion displays an image by the data signal and the power supply voltage supplied from the second substrate 204.

Figure 2:
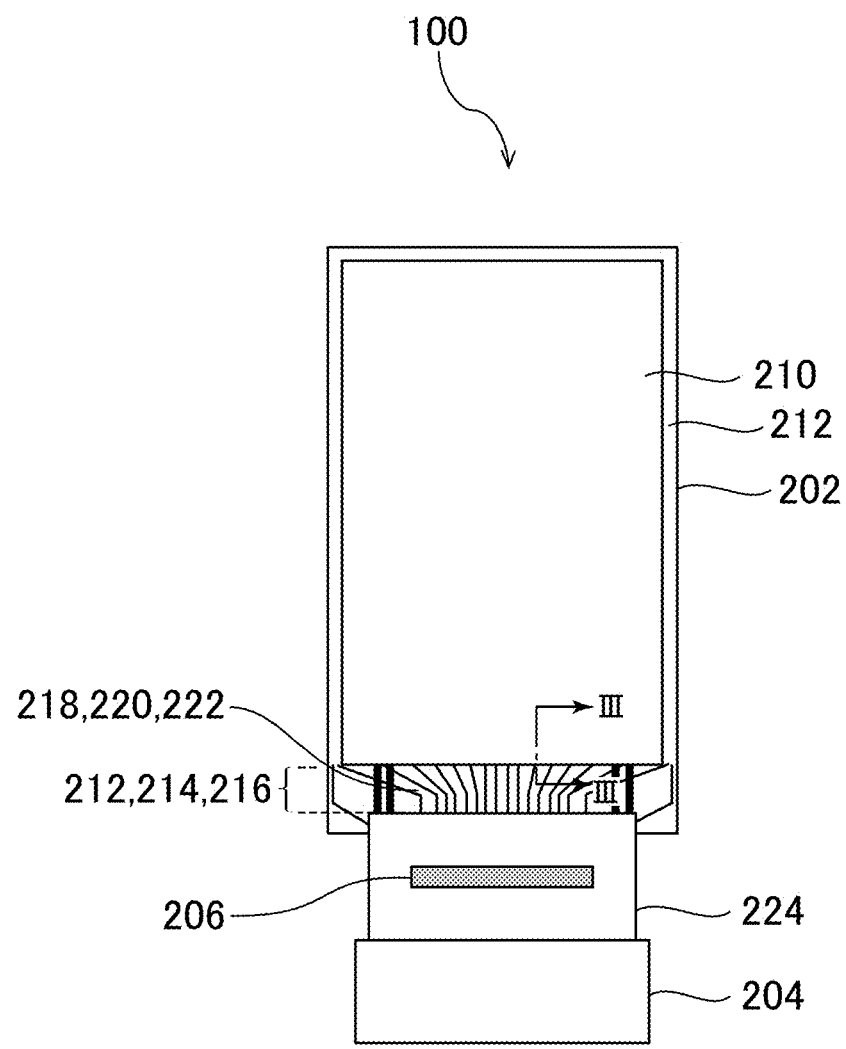
FIG. 2 is a diagram schematically illustrating a display panel according to a modification example of the present invention.

As illustrated in FIG. 2, the display panel 100 may have a configuration (hereinafter, set as a modification example) in which a COF film 224 is provided instead of a second substrate. Specifically, for example, the COF film 224 is formed of polyimide or the like and has flexibility. The driver IC 206 is arranged on the COF film 224. The driver IC 206 is a chip on film (COF). The COF film 224 on which the driver IC 206 is arranged is connected to the first substrate. The video signal generated by the driver IC 206 is supplied to the pixel array portion via the COF film 224 and the first wiring 218 to the third wiring 222 arranged on the connection area 214, the curved area 216, and the frame area 212.

Figure 3:
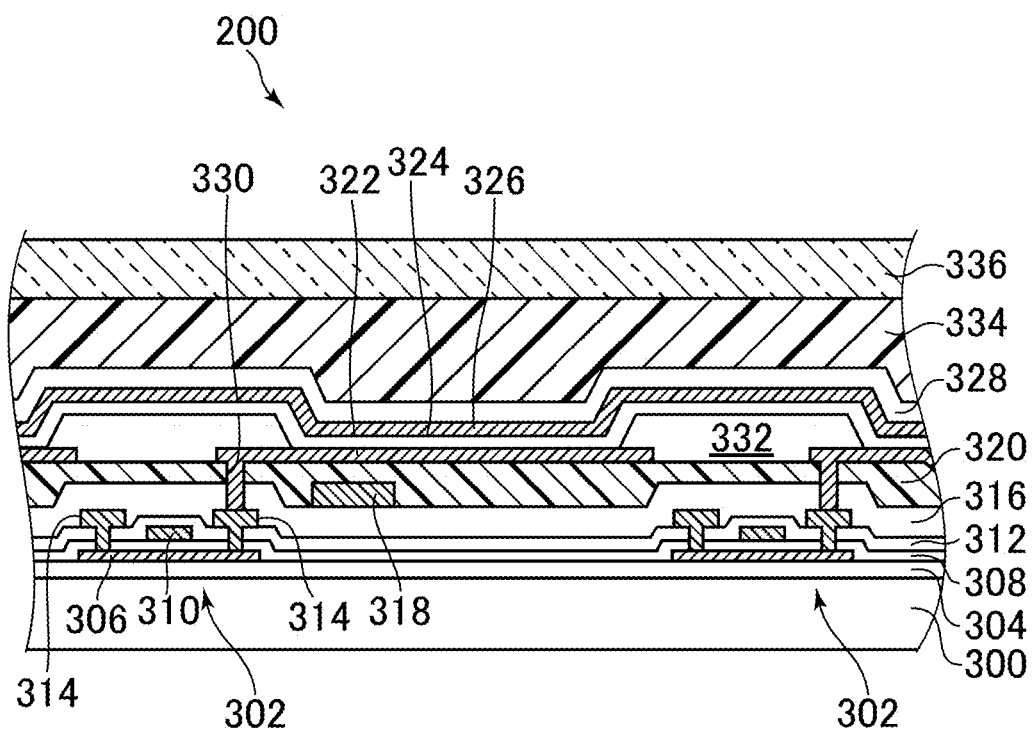
FIG. 3 is a diagram illustrating a cross section of the display panel.

Subsequently, a cross section of the display area 210 is described. FIG. 3 is a diagram schematically illustrating a cross section of the display panel 100 taken along the line III-III of FIGS. 1 and 2. The display panel 100 includes a structure in which a circuit layer including the TFTs 302 or the like, an organic EL element, a sealing film 328 that seals the organic EL element, and the like are laminated on an insulating base material 300 made of a resin film. The insulating base material 300 is formed, for example, by using a polyimide film. A cover film 336 that interposes an adhesive layer 334 is arranged on the sealing film 328.

In the present embodiment, the pixel array portion is a top emission type. The light emitted by the organic EL element is emitted to the opposite side of the insulating base material 300. When the display panel 100 performs color display by using a color filter, the color filter is arranged between the sealing film 328 and the adhesive film 334, or on the opposite substrate side. The organic EL element generates white light, and the white light passes through the color filter. Accordingly, each pixel arranged in the pixel array portion emits light, for example, red (R), green (G), or blue (B).

A pixel circuit, a scanning signal line, a video signal line, a driving power supply line, and the like are formed on the circuit layer of the display area 210. Specifically, an undercoat film 304 is formed on the insulating base material 300 as a base layer by using inorganic insulating material such as silicon nitride (SiNy) or silicon oxide (SiOx). A polysilicon (p-Si) film is formed on the undercoat film 304. The p-Si film is patterned, and the p-Si film in a portion used as the circuit layer selectively remains.

For example, a semiconductor layer 306 to be a channel portion and a source or drain portion of the top gate type TFT 302 is formed by using a p-Si film. A gate electrode layer 310 is arranged via a gate insulating film 308 on a channel portion of the TFT 302. The gate electrode layer 310 is formed by patterning a metal film formed by sputtering or the like.

Thereafter, a first interlayer insulating film 312 that covers the gate electrode layer 310 is laminated. Impurities are introduced into p-Si to be a source or a drain of the TFT 302 by ion implantation. A first SL layer 314 electrically connected to the source and the drain is formed. The TFTs 302 are formed in this manner.

Thereafter, a second interlayer insulating film 316 is laminated. A second SL layer 318 is formed on the front surface of the second interlayer insulating film 316 by sputtering or the like. The scanning signal line, the video signal line, and the driving power supply line are formed in a multilayer wiring structure by using the second SL layer 318, the gate electrode layer 310, and the first SL layer 314. A flattening film 320 is formed thereon, for example, by laminating an organic material such as an acrylic resin. An organic EL element is formed on the front surface of the display area 210 that is flattened by the flattening film 320.

The organic EL element includes a lower electrode 322, an organic EL layer 324, and an upper electrode 326. The lower electrode 322, the organic EL layer 324, and the upper electrode 326 are laminated in an order from the insulating base material 300 side. In the present embodiment, the lower electrode 322 is an anode of the organic EL element, and the upper electrode 326 is a cathode. The organic EL layer 324 includes a hole transport layer, a light-emitting layer, an electron transport layer, and the like.

If the TFT 302 illustrated in FIG. 3 is the driving TFT 302 having n channels, the lower electrode 322 is connected to the first SL layer 314 of the TFT 302. Specifically, after the flattening film 320 is formed as described above, contact holes 330 for connecting the lower electrodes 322 to the TFT 302 are formed. The lower electrodes 322 connected to the TFT 302 are formed for each pixel by patterning a conductive film formed on the front surface of the flattening film 320 and in the contact holes 330.

After the lower electrodes 322 are formed, banks 332 are formed at the pixel boundary. The lower electrodes 322 are exposed in the effective area of the pixel surrounded by the banks 332. After the banks 332 are formed, each layer that forms the organic EL layer 324 is sequentially laminated on the lower electrodes 322. The upper electrode 326 is formed by using a transparent electrode material on the organic EL layer 324.

The sealing film 328 is formed on the front surface of the upper electrode 326. For example, the sealing film 328 has a three-layer layered structure including an inorganic film, an organic film, and an inorganic film in this order from the bottom. The inorganic film is formed, for example, of an inorganic insulating material such as $SiO_2$, SiN, or SiON. The organic film is formed, for example, of an organic insulating material such as an acrylic resin, and the upper surface of the sealing film is flattened. The cover film 336 is arranged on the sealing film via the adhesive layer 334. The cover film 336 is formed of a cycloolefin polymer (COP) or triacetyl cellulose (TAC).

Subsequently, the display panel 100 in a curved state is described. FIG. 4A is a diagram schematically illustrating a cross section of the display panel 100 near the curved area 216. FIG. 4A is a diagram illustrating the display panel 100 of the embodiment illustrated in FIG. 1. As illustrated in FIGS. 4A and 4B, the display panel 100 includes the first substrate 202, the second substrate 204, the driver IC 206, a protective film 400, a polarizing plate 402, a reinforcing film 404, a heat diffusion sheet 406, a spacer 408, a reinforcing resin 410, and a cover glass 412.

The first substrate 202 is curved in the curved area 216. The second substrate 204 and the driver IC 206 are as described above. The protective film 400 is a film that protects the display panel 100. The polarizing plate 402 reduces the reflection of external light incident on the display panel 100. Therefore, the visibility of the display panel 100 is improved.

The reinforcing film 404 is a film that reinforces the display panel 100. Specifically, the reinforcing film 404 is arranged in a flat area on the back surface of the display panel 100 in a curved state.

The heat diffusion sheet 406 is a sheet that diffuses the heat of the display panel 100. Specifically, the heat diffusion sheet 406 diffuses the heat generated in the driving circuits arranged around the display panel 100 to the entire display panel 100. Accordingly, a state in which the temperature is high only in a portion of the display panel 100 is prevented.

The spacer 408 is arranged between a portion on the front surface side and a portion on the back surface side of the bent display panel 100. The spacer 408 maintains a distance between the portion on the front surface side and the portion on the back surface to be in a certain value or more. Accordingly, even if a pressure in a thickness direction is applied to the display panel 100, a curvature of the curved area 216 is maintained to be in an allowable range.

An end portion of the spacer 408 is formed to be a curved surface with a curvature corresponding to the back surface of the curved area 216. If the end portion of the spacer 408 is brought into contact with the back surface of the curved area 216, even if a pressure is applied to the front surface of the curved area 216, a shape of the curved area 216 can be constantly maintained. A stress applied to the first wiring 218 to the third wiring 222 arranged in the curved area 216 is reduced by the spacer 408 so that it is less likely that the first wiring 218 to the third wiring 222 are disconnected.

The reinforcing resin 410 is a resin for reinforcing the display panel 100. The reinforcing resin 410 is arranged in the curved area 216 of the display panel 100 in a curved state. The reinforcing resin 410 is applied to a bent area of the display panel 100.

The cover glass 412 is glass for protecting the front surface of the display panel 100. The cover glass 412 is arranged on the polarizing plate 402 with respect to the display panel 100 in a bent state. The cover glass 412 may be made of a resin such as acryl.

The reinforcing resin 410 may not be bonded to the curved area 216. According to the configuration, flexibility of the curved area 216 is increased so that the display panel 100 can be curved in a smaller curvature radius. As the curvature radius of the curved area 216 is smaller, the size of the bent display panel 100 in a plan view decreases, and the thickness of the bent display panel 100 also decreases.

FIG. 4B is a diagram schematically illustrating a cross section of the display panel 100 near the curved area 216 in the modification example. The display panel includes the COF film 224. The driver IC 206 is arranged on the COF film 224. Other configurations are the same as the configuration illustrated in FIG. 4A.

Figure 5:
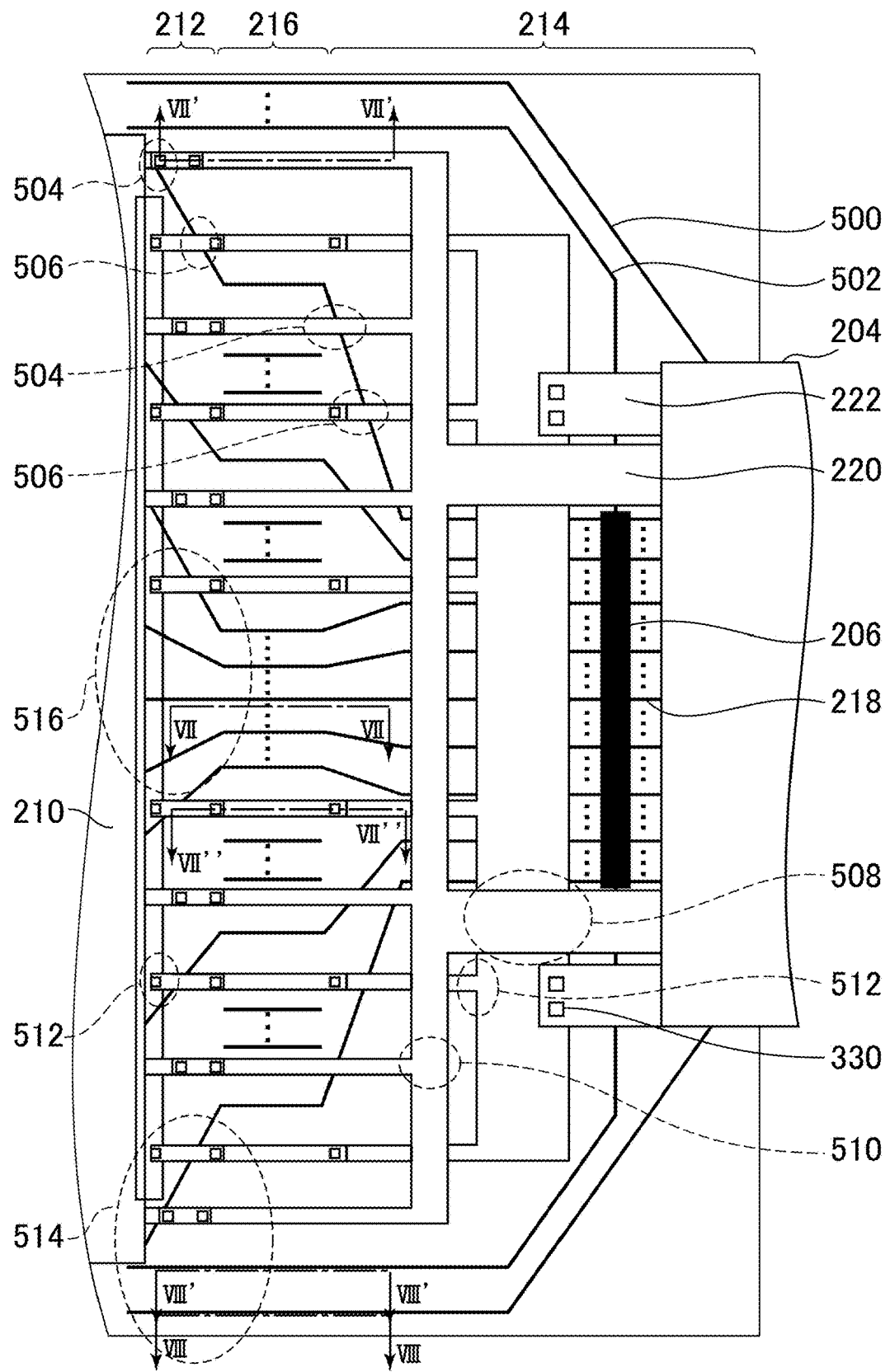
FIG. 5 is an enlarged view of a frame area, a curved area, and a connection area.
Figure 6:
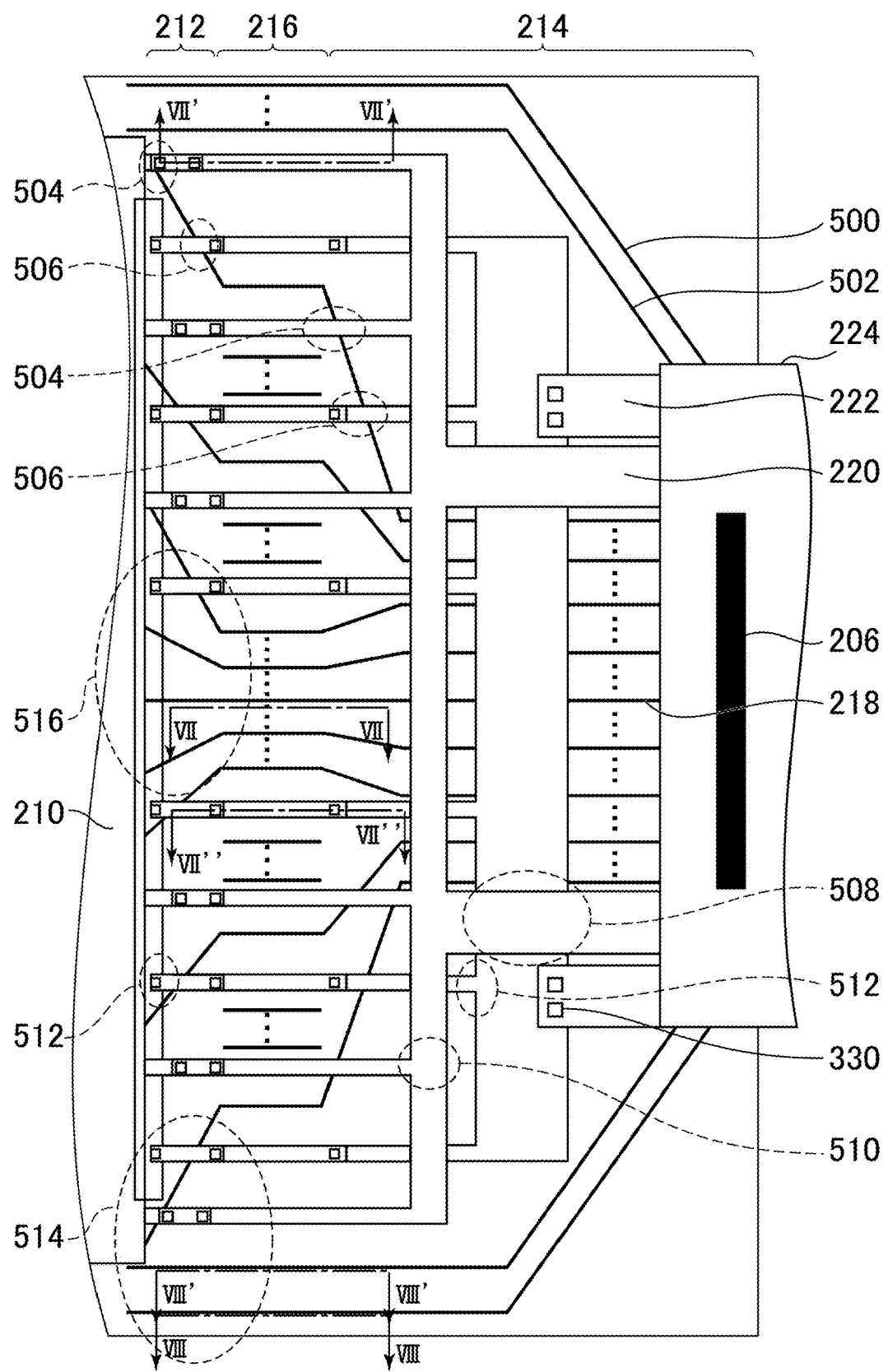
FIG. 6 is an enlarged view of a frame area, a curved area and a connection area according to the modification example.
Figure 7A:
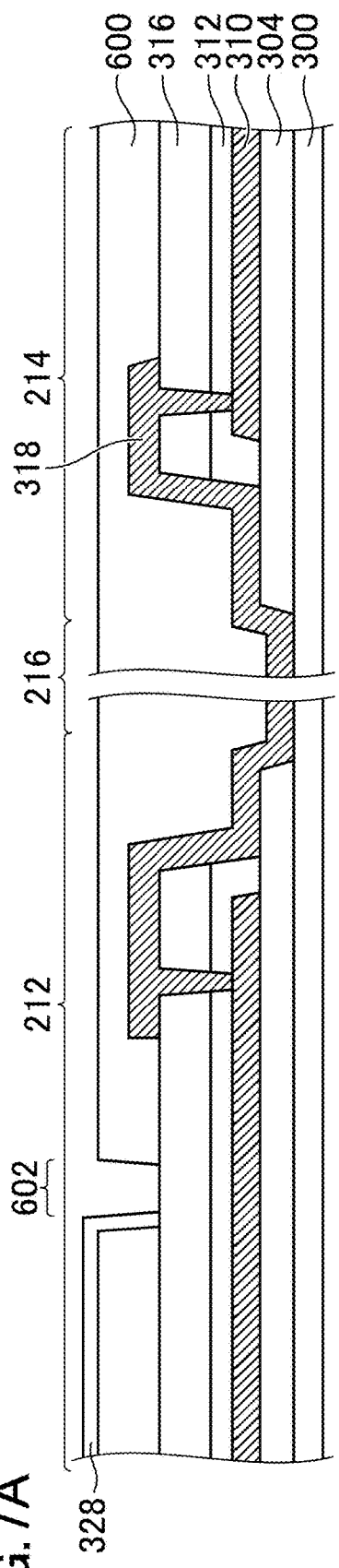
FIG. 7A is a diagram illustrating a cross section of the frame area, the curved area, and the connection area.
Figure 7B:
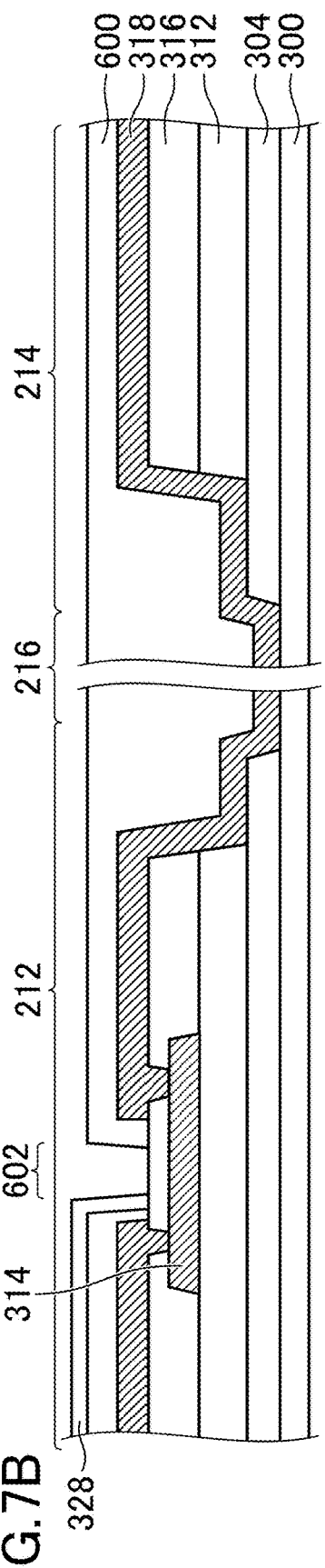
FIG. 7B is a diagram illustrating a cross section of the frame area, the curved area, and the connection area.
Figure 7C:
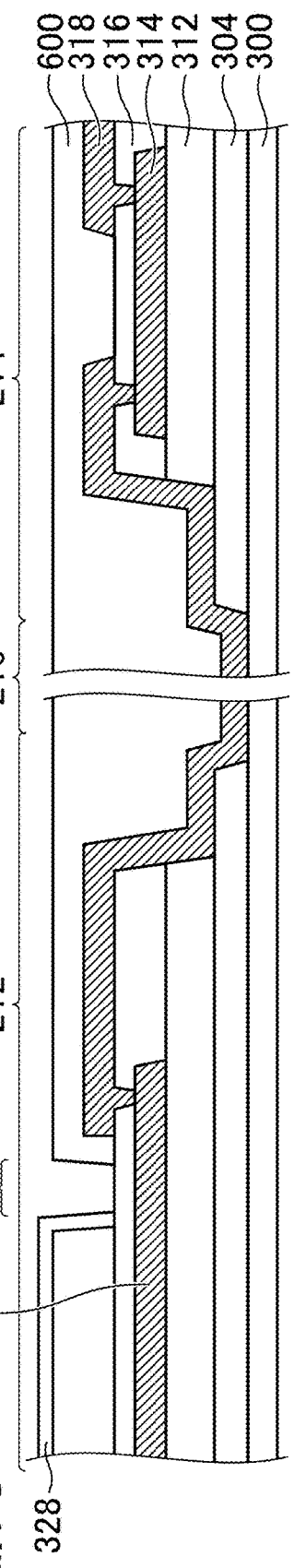
FIG. 7C is a diagram illustrating a cross section of the frame area, the curved area, and the connection area.

Subsequently, details of the frame area 212, the curved area 216, and the connection area 214 are described. FIG. 5 is an enlarged view of the frame area 212, the curved area 216, and the connection area 214. FIG. 6 is an enlarged view of the frame area 212, the curved area 216, and the connection area 214 in the modification example. FIGS. 7A to 7C are diagrams illustrating cross sections taken along the lines VII-VII, VII'-VII', and VII"-VII" in FIGS. 5 and 6, respectively. FIGS. 8A and 8B are diagrams illustrating cross sections taken along the line VIII-VIII and VIII'-VIII' in FIGS. 5 and 6, respectively.

As illustrated in FIG. 5, the frame area 212, the curved area 216, and the connection area 214 are arranged in an order from the display area 210 to the driver IC 206. In the frame area 212, the curved area 216, and the connection area 214, the plurality of first wirings 218, the second wiring 220, the third wiring 222, the Y driver power supply line 500, and the Y driver signal line 502 are arranged.

As illustrated in FIG. 5, the driver IC 206 is arranged in the connection area 214 of the first substrate 202. Meanwhile, in the modification example, as illustrated in FIG. 6, the driver IC 206 is arranged on the COF film 224. The COF film 224 is arranged on the first substrate 202.

The first wiring 218 is connected to the pixel array portion in the display area 210 and is connected to the driver IC 206 in the connection area 214. The second wiring 220 and the third wiring 222 are connected to the pixel array portion in the display area 210 and connected to the second substrate 204 in the connection area 214. Specifically, the first wiring 218 supplies the video signal supplied from the driver IC 206 to the pixel array portion. The second wiring 220 and the third wiring 222 supply a different power supply voltage supplied from the second substrate 204 to the pixel array portion. The signal and the power supply supplied to the first wiring 218 to the third wiring 222 are limited to this, and may be other signals or power supplies.

The Y driver power supply line 500 and the Y driver signal line 502 are connected to the Y driver in the frame area 212. The Y driver power supply line 500 is connected to the second substrate 204 in the connection area 214. The Y driver signal line 502 is connected to the driver IC 206 in the connection area 214. The Y driver power supply line 500 supplies the power supply voltage supplied from the second substrate 204 to the Y driver. The Y driver signal line 502 supplies the Y driver control signal supplied from the driver IC 206 to the Y driver. The Y driver supplies a signal for selecting a pixel or the like to the pixel array portion.

The plurality of first wirings 218 are provided on the first layer in the curved area 216. The plurality of first wirings 218 are arranged on the second layer in the connection area 214 and the frame area 212 adjacent to the curved area 216.

Specifically, for example, as illustrated in FIG. 7A, the first wiring 218 is configured with the gate electrode layer 310 and the second SL layer 318. The first wiring 218 in the curved area 216 is the second SL layer 318 arranged on the insulating base material 300. The first wiring 218 in the connection area 214 is configured with the second SL layer 318 arranged from the undercoat film 304 to the second interlayer insulating film 316, and the gate electrode layer 310 connected to the second SL layer 318 via the contact hole 330. The first wiring 218 in the frame area 212 is configured with the second SL layer 318 arranged from the undercoat film 304 to the second interlayer insulating film 316, and the gate electrode layer 310 connected to the second SL layer 318 via the contact hole 330.

The plurality of first wirings 218 are arranged parallel to each other in the curved area 216. Specifically, as illustrated in FIG. 5, the plurality of first wirings 218 are arranged parallel to a first direction in the curved area 216. The first direction is a direction (direction facing from the right to the left in FIG. 5) facing from the connection area 214 to the frame area 212.

A portion of the plurality of first wirings 218 is arranged to be inclined to the same side with respect to the first direction in the connection area 214. Specifically, for example, in the connection area 214, the plurality of first wirings 218 arranged on the upper end side with respect to the center portion of FIG. 5 are arranged to be inclined to the right side with respect to the first direction.

In the connection area 214, the plurality of first wirings 218 may include a plurality of first wirings arranged be inclined to the same side with respect to the first direction, and may include the first wirings 218 arranged be inclined to the opposite side. For example, the plurality of first wirings 218 arranged on the lower end side with respect to the center portion of FIG. 5 are arranged to be inclined to the left side with respect to the first direction. Near the center portion of FIG. 5, the plurality of first wirings 218 includes the first wiring 218 arranged to be inclined to the right side and the first wiring 218 arranged to be inclined to the left side with respect to the first direction.

A portion of the plurality of first wirings 218 is arranged to be inclined to the same side with respect to the first direction in the frame area 212. Another portion of the plurality of first wirings 218 is arranged to be inclined to the opposite side with respect to the first direction in the frame area 212. Specifically, for example, in the frame area 212, the plurality of first wirings 218 arranged on the upper side with respect to the center of the display panel 100 of FIG. 5 are arranged to be inclined to the right side with respect to the first direction. The plurality of first wirings 218 arranged on the lower side with respect to the center of the display panel 100 of FIG. 5 are arranged to be inclined to the left side with respect to the first direction.

The second wiring 220 is provided on the first layer and arranged between the plurality of first wirings 218 in the curved area 216. The second wiring 220 is provided on a layer different from the second layer in the connection area 214 and the frame area 212, and is arranged to intersect with at least a portion of the plurality of first wirings 218 in a plan view.

Specifically, for example, as illustrated in FIG. 7B, the second wiring 220 is configured with the first SL layer 314 and the second SL layer 318. The second wiring 220 is the second SL layer 318 arranged on the insulating base material 300 in the curved area 216. The second wiring 220 is the second SL layer 318 arranged from the undercoat film 304 to the second interlayer insulating film 316 in the connection area 214. In the frame area 212, the second wiring 220 is configured with the second SL layer 318 arranged from the undercoat film 304 to the second interlayer insulating film 316, the first SL layer 314 connected to the second SL layer 318 via the contact hole 330, and the second SL layer 318 connected to the first SL layer 314 via the contact hole 330.

As illustrated in FIG. 5, the second wiring 220 is arranged parallel to each other between the plurality of first wirings 218 in the curved area 216. In the connection area 214, the second wiring 220 and the first wiring 218 intersect with each other in a plan view. In the intersecting area, the first wiring 218 is configured with the gate electrode layer 310, and the second wiring 220 is configured with the second SL layer 318. Accordingly, the short circuit between the first wiring 218 and the second wiring 220 in intersecting areas 504 can be prevented. In the same manner, in the frame area 212, the second wiring 220 and the first wiring 218 are arranged to intersect with each other in a plan view, but are arranged on different layers, so the short circuit between the second wiring 220 and the first wiring 218 is prevented.

The third wiring 222 is provided on the first layer and arranged between the plurality of first wirings 218 in the curved area 216. The third wiring 222 is provided on a layer different from the second layer in the connection area 214 and the frame area 212, and arranged to intersect with at least a portion of the plurality of first wirings 218 in a plan view.

Specifically, as illustrated in FIG. 7C, the third wiring 222 is configured with the first SL layer 314 and the second SL layer 318. The third wiring 222 is the second SL layer 318 arranged on the insulating base material 300 in the curved area 216. In the connection area 214, the third wiring 222 is configured with the second SL layer 318 arranged from the undercoat film 304 to the second interlayer insulating film 316, the first SL layer 314 connected to the second SL layer 318 via the contact hole 330, and the second SL layer 318 connected to the first SL layer 314 via the contact hole 330. In the frame area 212, the third wiring 222 is configured with the second SL layer 318 arranged from the undercoat film 304 to the second interlayer insulating film 316, and the first SL layer 314 connected to the second SL layer 318 via the contact hole 330.

As illustrated in FIG. 5, the third wiring 222 is arranged parallel to each other between the plurality of first wirings 218 in the curved area 216. In the connection area 214, the third wiring 222 and the first wiring 218 intersect with each other in a plan view. In intersecting areas 506, the first wiring 218 is configured with the gate electrode layer 310, and the third wiring 222 is configured with the first SL layer 314. Accordingly, the short circuit between the first wiring 218 and the third wiring 222 in the intersecting area can be prevented. In the same manner, in the frame area 212, the third wiring 222 and the first wiring 218 are arranged to intersect with each other in a plan view, but are arranged on the different layers, so the short circuit between the third wiring 222 and the first wiring 218 is prevented.

In the connection area 214, the second wiring 220 and the third wiring 222 are arranged in an intersecting manner. In the intersecting area, the second wiring 220 is configured with the second SL layer 318, and the third wiring 222 is configured with the first SL layer 314. Accordingly, in an intersecting area 508, the short circuit between the second wiring 220 and the third wiring 222 can be prevented.

In the connection area 214, the second wiring 220 has a branch point 510. Specifically, for example, as illustrated in FIG. 5, the second wiring 220 includes an area parallel to the first direction and an area parallel to the second direction orthogonal to the first direction. Two branched second wirings 220 parallel to the first direction are connected to the second substrate 204 at two positions. The two branched second wirings 220 are bound into one in an area of the connection area 214 which is arranged parallel to the second direction. The second wiring 220 bound into one is branched into six toward the curved area 216 side.

In the same manner, in the connection area 214, the third wiring 222 includes a branch point 512. Specifically, for example, the third wiring 222 includes an area parallel to the first direction and an area parallel to the second direction. The two branched third wirings 222 parallel to the first direction are connected to the second substrate 204 at two positions. The two branched third wirings 222 are bound into one in an area of the connection area 214 which is arranged parallel to the second direction. The third wiring 222 bound into one is branched into six toward the curved area 216 side. Each of the branched second wiring 220 and the branched third wiring 222 is arranged parallel to the first direction in the curved area 216. The number of branch points is not limited to the example illustrated in FIG. 5, and the second wiring 220 and the third wiring 222 may have a more or a smaller number of branch points than the above. The second wiring 220 and the third wiring 222 may not include the branches 510 and 512.

In at least a portion of the area of the curved area 216, the branched second wiring 220 and the branched third wiring 222 are alternately arranged, and the plurality of first wirings 218 are arranged between the branched second wiring 220 and the branched third wiring 222. Specifically, for example, in the curved area 216, the branched second wiring 220 and the branched third wiring 222 are alternately arranged from the upper side and the lower side toward the center portion of FIG. 5. The plurality of first wirings 218 are arranged between the branched second wiring 220 and the branched third wiring 222 which are alternately arranged. As described below, an area in which the first wiring 218 is not arranged may be provided between the branched second wiring 220 and the branched third wiring 222.

The Y driver power supply line 500 and the Y driver signal line 502 are arranged on the external side of the first wiring 218 to the third wiring 222. Specifically, the Y driver signal line 502 is arranged so that the second substrate 204 and the Y driver are connected on the external side of the first wiring 218 to the third wiring 222. The Y driver power supply line 500 is arranged so that the second substrate 204 and the Y driver are connected on the external side of the Y driver signal line 502.

The Y driver power supply line 500 and the Y driver signal line 502 are configured with the gate electrode layer 310 and the second SL layer 318. For example, as illustrated in FIGS. 8A and 8B, the Y driver power supply line 500 and the Y driver signal line 502 in the curved area 216 are the second SL layer 318 arranged on the first substrate 202. The Y driver power supply line 500 and the Y driver signal line 502 in the connection area 214 are configured with the second SL layer 318 arranged from the undercoat film 304 to the second interlayer insulating film 316. The Y driver power supply line 500 in the frame area 212 is configured with the second SL layer 318 arranged from the undercoat film 304 to the second interlayer insulating film 316, the gate electrode layer 310 connected to the second SL layer 318 via the contact hole 330, and the second SL layer 318 connected to the gate electrode layer 310 via the contact hole 330. The Y driver signal line 502 in the frame area 212 is configured with the second SL layer 318 arranged from the undercoat film 304 to the second interlayer insulating film 316 and the gate electrode layer 310 connected to the second SL layer 318 via the contact hole 330.

In the frame area 212, the second wiring 220 and the third wiring 222 each include branch points and may intersect with the first wiring 218 in a plan view. In FIG. 5, an example in which only the third wiring 222 includes the branch point 512 in the frame area 212 is illustrated, but each of the second wiring 220 and the third wiring 222 may include branch point in the frame area 212 or and may not include branch points.

As illustrated in FIGS. 7A to 7C and FIGS. 8A and 8B, an organic insulating film 600 or the flattening film 320 may have discontinuity (hereinafter, referred to as a moisture blocking structure 602) in a portion of the frame area 212. The material of the organic insulating film 600 or the flattening film 320 is photosensitive acrylic or polyimide. The intrusion of the moisture into the display area 210 via the organic insulating film 600 or the flattening film can be prevented by the moisture blocking structure 602. Accordingly, the deterioration of the pixel array portion and the EL element due to the moisture can be reduced. If the moisture blocking structure 602 is not included, the first SL layer 314 may not be provided in the frame area 212. In this case, the second wiring 220 and the third wiring 222 in the frame area 212 are configured with the second SL layer 318. The organic insulating film 600 illustrated in FIGS. 7A to 7C and FIGS. 8A and 8B corresponds to the flattening film 320 and/or the bank 332 in FIG. 3.

Figure 9:
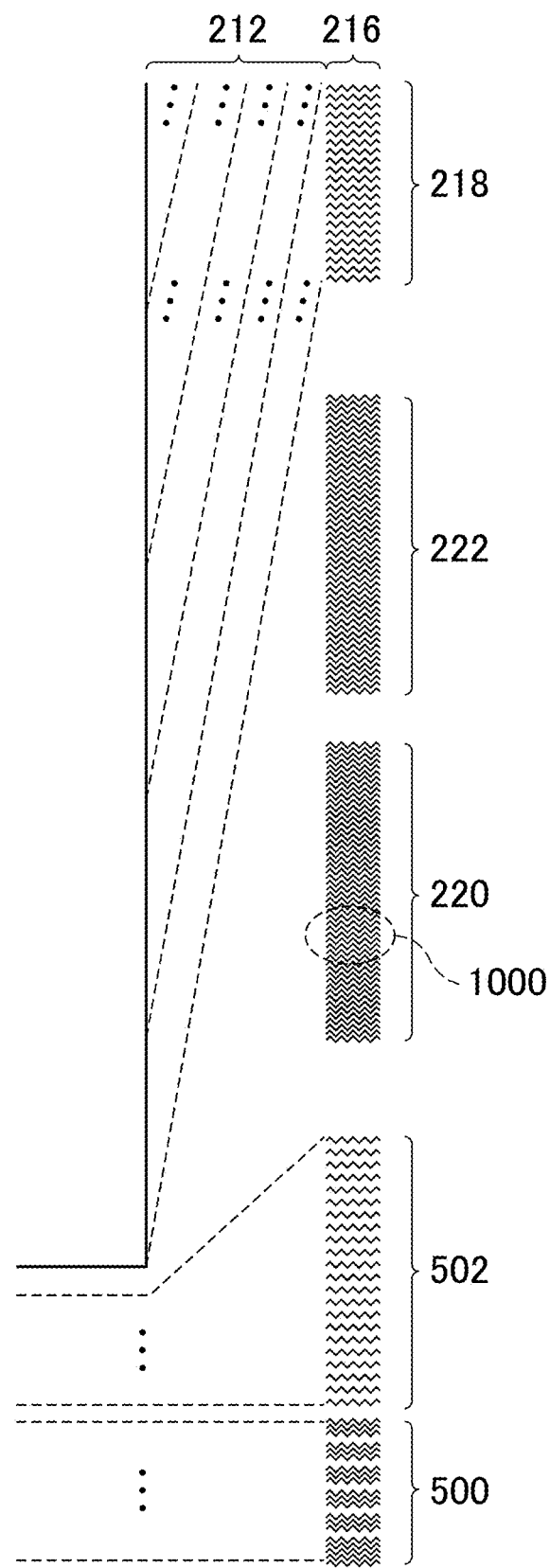
FIG. 9 is an enlarged view of a corner of the display area.
Figure 10:
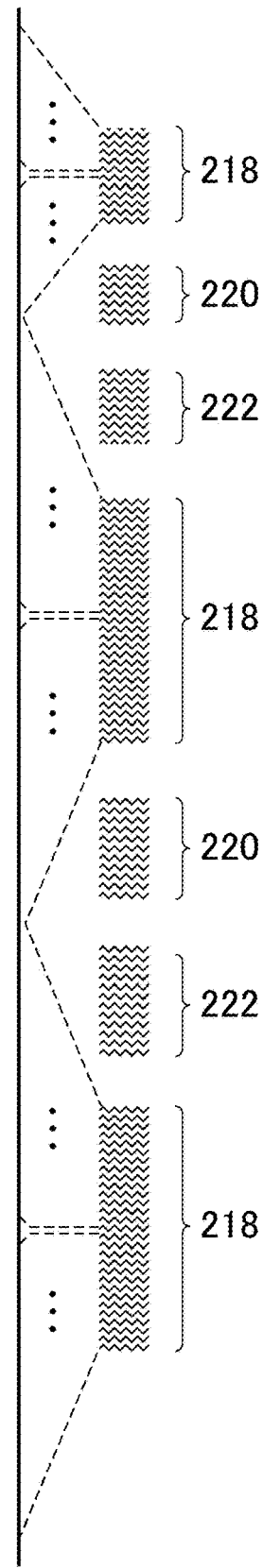
FIG. 10 is an enlarged view of an end portion of the display area.

FIG. 9 is an enlarged view of a corner 514 of the display area 210. FIG. 10 is an enlarged view of an end portion 516 of the frame area 212 of FIG. 5.

As illustrated in FIG. 9, in an order from the outside of the display panel 100, the Y driver power supply line 500, the Y driver signal line 502, the second wiring 220, the third wiring 222, and the first wiring 218 are arranged. Positions of the second wiring 220 and the third wiring 222 may be switched. As illustrated in FIG. 10, near the end portion 516 of the frame area 212, the first wiring 218, the second wiring 220, and the third wiring 222 are sequentially arranged. The first wiring 218 may be provided between all of the second wiring 220 and the third wiring 222.

The second wiring 220, the third wiring 222, the Y driver power supply line 500, and the Y driver signal line 502 in the connection area 214 and the frame area 212 are configured with one wiring. Meanwhile, as illustrated in FIGS. 9 and 10, not only the first wiring 218 but also the second wiring 220, the third wiring 222, the Y driver power supply line 500, and the Y driver signal line 502 in the curved area 216 each are configured with a set of a plurality of wirings. Accordingly, the electrical resistance of the wiring arranged in the curved portion can be reduced.

Figure 11:
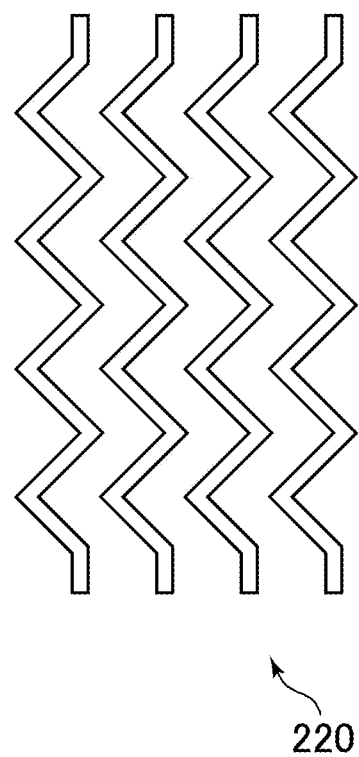
FIG. 11 is an enlarged view of a second wiring.

Each wiring that configures the first wiring 218 to the third wiring 222 in the curved area 216 may alternately include an area arranged to be inclined to the right side and an area arranged to be inclined to the left side with respect to the extending direction of the first wiring 218 to the third wiring 222. FIG. 11 is an enlarged view of a portion 1000 of the second wiring 220 in the curved area 216 of FIG. 9. As illustrated in FIG. 11, the second wiring 220 is a bundle of a plurality of wirings, and each wiring is formed in a zigzag shape. Accordingly, the likeliness of the cutting of the second wiring 220 when the display panel 100 is curved can be further reduced. The first wiring 218, the third wiring 222, the Y driver power supply line 500, and the Y driver signal line 502 may have the same shape.

Within the scope of the idea of the present invention, those skilled in the art can easily conceive various changes and modifications, and it is understood that these changes and modifications also belong to the scope of the present invention. For example, with respect to each of the above embodiments, those obtained by appropriately adding or deleting components, or changing a design thereof, or adding or omitting a process or changing a condition thereof by those skilled in the art are included in the scope of the present invention, without departing from the gist of the present invention.

What is claimed is:

1. A display device comprising:
    a plurality of first wirings which are provided on a first layer and each of which is arranged parallel to a first direction in a first area, and which are arranged on a second layer in a second area adjacent to the first area;
    a second wiring which is provided in the first layer and is arranged between the plurality of first wirings in the first area and which is provided on a layer different from the second layer in the second area; and
    a third wiring which is provided on the first layer and arranged between the plurality of first wirings in the first area and which is provided on a layer different from the second layer and arranged to intersect with at least a portion of the plurality of first wirings in a plan view, in the second area, wherein
    a portion of the plurality of first wirings is arranged to be inclined to the same side in the first direction in the second area, and
    the second wiring is arranged to intersect with a portion of the plurality of first wirings in a plan view, in the second area.

2. The display device according to claim 1, wherein
    the second and third wirings each have branch points in the second area, and
    the branched second and third wirings each are arranged parallel in the first area.

3. The display device according to claim 2, wherein
    the branched second and third wirings are alternately arranged and the plurality of first wirings are arranged between the branched second wiring and the third wiring in at least a portion of the first area.

4. The display device according to claim 1, wherein
    the first to third wirings each are configured in a set of a plurality of wirings in the first area, and
    each wiring that configures the first to third wirings alternately includes an area arranged to be inclined to a right side and an area arranged to be inclined to a left side with respect to an extending direction of the first to third wirings.

5. The display device according to claim 1, further comprising:
    a third area on a side of the first area opposite to the second area, wherein
    in the third area, the second and third wirings each have branch points and intersect with the first wiring in a plan view.

6. The display device according to claim 5, wherein
    the third area is a frame area arranged around a display area including a pixel array portion,
    the second area is a connection area which is arranged on aback surface side of the display area and supplies a power supply voltage and a video signal, and
    the first area is a curved area that links the frame area and the connection area and is curved so that the connection area is arranged on the back surface of the display area.

7. The display device according to claim 1, wherein
    a video signal is input to the first wiring, and
    different power supply voltages are input to the second and third wirings.

* * * * *